(12) United States Patent
Mauerer et al.

(10) Patent No.: US 10,027,319 B2
(45) Date of Patent: Jul. 17, 2018

(54) CIRCUIT ARRANGEMENT FOR CONTROLLING POWER TRANSISTORS OF A POWER CONVERTER

(71) Applicant: ETEL S.A., Motiers (CH)

(72) Inventors: Mario Mauerer, Zurich (CH); Johann W. Kolar, Zurich (CH)

(73) Assignee: ETEL S.A., Motiers (CH)

( * ) Notice: Subject to any disclaimer, the term of this patent is extended or adjusted under 35 U.S.C. 154(b) by 9 days.

(21) Appl. No.: 15/344,616

(22) Filed: Nov. 7, 2016

(65) Prior Publication Data
US 2017/0149428 A1    May 25, 2017

(30) Foreign Application Priority Data

Nov. 19, 2015    (EP) ..................................... 15195304

(51) Int. Cl.
| | |
|---|---|
| H03K 17/16 | (2006.01) |
| H03K 17/689 | (2006.01) |
| H03K 5/156 | (2006.01) |
| H02M 3/157 | (2006.01) |

(52) U.S. Cl.
CPC .......... *H03K 17/162* (2013.01); *H02M 3/157* (2013.01); *H03K 5/1565* (2013.01); *H03K 17/689* (2013.01)

(58) Field of Classification Search
None
See application file for complete search history.

(56) References Cited

U.S. PATENT DOCUMENTS

| | | | |
|---|---|---|---|
| 6,628,219 B2 | 9/2003 | Dedic | |
| 6,853,322 B2 | 2/2005 | Dedic et al. | |
| 7,302,282 B2 | 11/2007 | McKim, Jr. et al. | |
| 7,668,975 B2 | 2/2010 | McKim, Jr. et al. | |
| 7,920,010 B2 * | 4/2011 | Chen, Jr. ............. | H01F 17/0006 326/21 |
| 8,742,841 B2 | 6/2014 | Alexander | |
| 2009/0309643 A1 | 12/2009 | Suzuki et al. | |
| 2014/0049295 A1 * | 2/2014 | Gan ..................... | H03K 17/691 327/109 |

FOREIGN PATENT DOCUMENTS

| | | |
|---|---|---|
| DE | 202004012961 U1 | 10/2004 |
| GB | 2373654 A | 9/2002 |

* cited by examiner

*Primary Examiner* — Long Nguyen
(74) *Attorney, Agent, or Firm* — Leydig, Voit & Mayer, Ltd.

(57) ABSTRACT

A circuit arrangement for controlling power transistors of a power converter includes a logic circuit configured to generate a pulse-width modulation (PWM) signal and a clock generator configured to generate a clock signal. A first and a second isolator are configured to galvanically isolate transmission of the PWM signal and the clock signal into a high-voltage portion of the power converter so as to produce a galvanically isolated PWM signal and a galvanically isolated clock signal. The first isolator for the PWM signal is configured transmit both DC voltage signals and AC voltage signals. A correction circuit is configured to correct jitter of the galvanically isolated PWM signal based on the galvanically isolated clock signal. The second isolator for the clock signal exhibits a jitter lower than that of the first isolator by a factor of at least two.

13 Claims, 2 Drawing Sheets

CIRCUIT ARRANGEMENT FOR CONTROLLING POWER TRANSISTORS OF A POWER CONVERTER

CROSS-REFERENCE TO PRIOR APPLICATION

Priority is claimed to European Patent Application No. EP 15 195 304.9 filed on Nov. 19, 2015, the entire disclosure of which is hereby incorporated by reference herein

FIELD

The present invention relates to a circuit arrangement for controlling power transistors of a power converter. Such power transistors are often connected in a half-bridge circuit between an upper and a lower potential, so that a common connection of two transistors can be switched between these two potentials by alternately switching the transistors on and off. In this way, any desired potential between the upper and lower potentials may be generated on average over time.

Such power converters are used, for example, in controlling positioning devices when the electric drives thereof are to be controlled such that the drive assumes a particular position. For this purpose, the power transistors are controlled, for example, using the generally known pulse-width modulation (PWM). For reasons of safety, the digital PWM signals generated for controlling the power transistors must be galvanically isolated from the high voltage used for operating the electric drives. This is often accomplished using optocouplers, which are capable of transmitting a signal by light. Such optocouplers have the advantage that they can be used independently of the frequency of a signal, while transmitters operating based on the transformer principle require a certain minimum frequency. However, the use of optocouplers results in the digital switching signals being transmitted in a time-delayed manner. This delay is not constant, but subject to minor variations. These variations are referred to as jitter, which causes time variation or uncertainty of the edges in the transmitted digital signals.

In the control of positioning devices, this jitter produces broadband noise in the control of the drives, and ultimately therefore in the movement thereof, thus deteriorating the positioning accuracy. The switching operations in the half-bridges of a power converter do occur exactly at the desired points in time, but deviate randomly therefrom.

BACKGROUND

In digital audio amplifier applications, jitter in the control of the power transistors results in distorted signals in the control of loudspeakers. To reduce jitter in audio signals, it has already been proposed in U.S. Pat. No. 8,742,841 B2 to transmit a digital audio signal and a clock signal separately and to resynchronize the audio signal after a potential shift of the two signals. However, no details are disclosed with respect to the potential shift and, moreover, such details would certainly not be applicable to the completely different safety requirements in the power converter technology used in positioning devices, where voltages of several hundred volts are used which must be switched at high frequencies.

SUMMARY

In an embodiment, the present invention provides a circuit arrangement for controlling power transistors of a power converter. A logic circuit is configured to generate a pulse-width modulation (PWM) signal and a clock generator configured to generate a clock signal. A first and a second isolator are configured to galvanically isolate transmission of the PWM signal and the clock signal into a high-voltage portion of the power converter so as to produce a galvanically isolated PWM signal and a galvanically isolated clock signal. The first isolator for the PWM signal is configured transmit both DC voltage signals and AC voltage signals. A correction circuit is configured to correct jitter of the galvanically isolated PWM signal based on the galvanically isolated clock signal. The second isolator for the clock signal exhibits a jitter lower than that of the first isolator by a factor of at least two.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations embodiments of the invention. The features and advantages of various embodiments of the present invention will become apparent by reading the following detailed description with reference to the attached drawings which illustrate the following.

DETAILED DESCRIPTION

Figure 1:
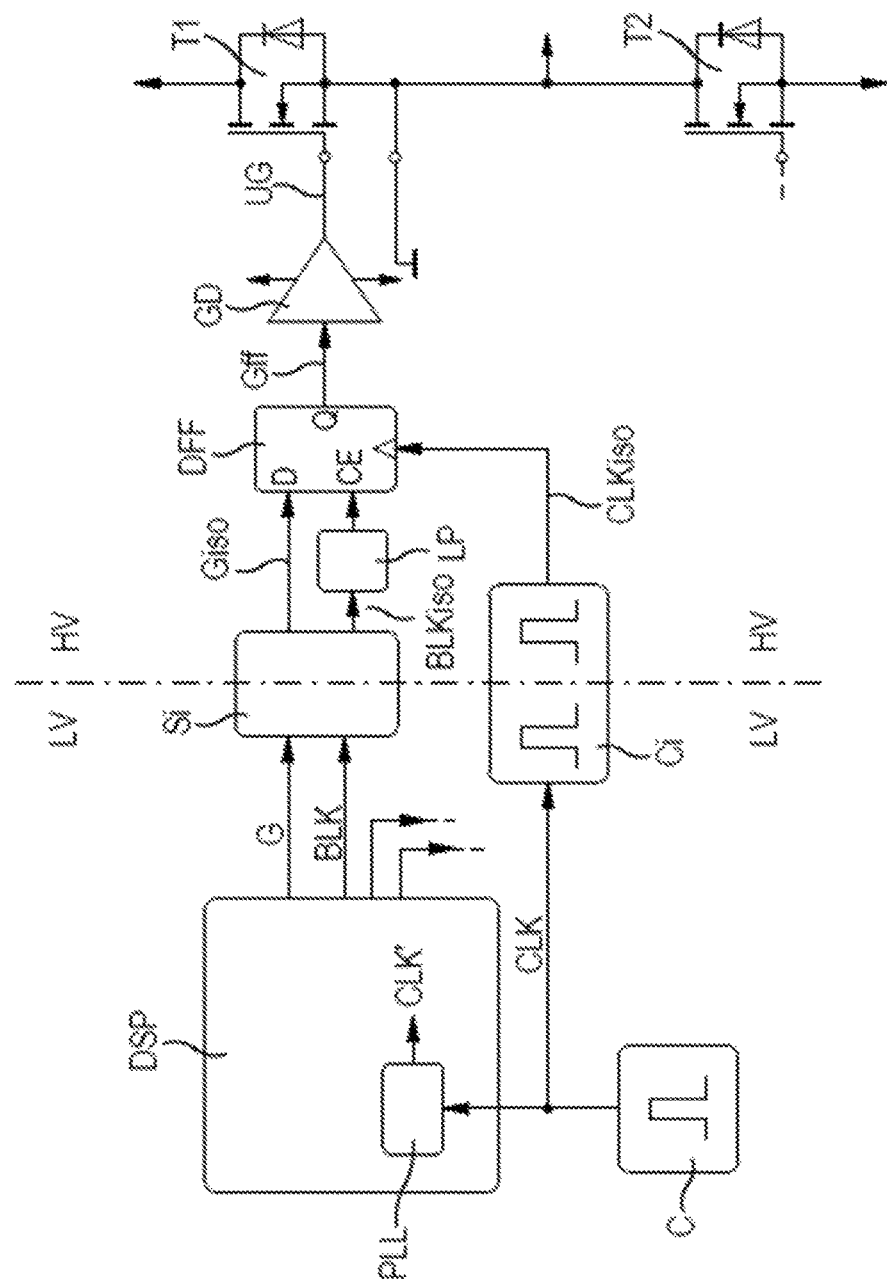
FIG. 1 shows a circuit arrangement according to an embodiment of the present invention.

In an embodiment, the present invention provides a circuit arrangement for controlling power transistors of a power converter, which circuit arrangement is capable of providing galvanic isolation between the signal processor for generating PWM signals and the power transistors without causing excessive jitter in the control of the transistors.

According to an embodiment, a circuit arrangement for controlling power transistors of a power converter is provided, the circuit arrangement including a logic circuit for generating a PWM signal and a clock generator for generating a clock signal, as well as a first and a second isolator for galvanically isolated transmission of the PWM signal and the clock signal into a high-voltage portion of the power converter, whereby a galvanically isolated PWM signal and a galvanically isolated clock signal are produced. The circuit arrangement further includes a correction circuit that corrects jitter of the galvanically isolated PWM signal based on the galvanically isolated clock signal, and is characterized in that the first isolator for the PWM signal is designed to be capable of transmitting both DC voltage signals and AC voltage signals and that the second isolator for galvanically isolated transmission exhibits a jitter lower than that of the first isolator by a factor of at least two, preferably a factor of five, more preferably a factor of ten.

The first isolator may take the form of an optocoupler or a digital signal isolator and must be able to transmit also signals having very low frequencies (i.e., also DC voltage signals). Such components are commercially available, but have the disadvantage of adding a considerable amount of jitter to the transmitted signal. This means that the edges of the transmitted signal no longer correlate particularly well with the original signal or that the transmitted signal is noisy.

The second isolator is configured, for example, as a high-frequency transformer based on LVDS components. The clock signal is connected by an LVDS driver to the primary side of a high-frequency transformer. On the secondary side, the high-frequency transformer is connected to an LVDS receiver, which then outputs the galvanically isolated clock signal. Such an arrangement is capable of transmitting high-frequency clock signals with frequencies up to and beyond 200 MHz in a galvanically isolated manner. In the process, a very small amount of jitter, typically in the range of a few picoseconds, is added to the clock signal. This means that the edges of the galvanically isolated clock signal correlate temporally very well with the edges of the original clock signal. In other words, very little noise is added to the clock signal.

Using the correction circuit, the galvanically isolated PWM signal can be synchronized with the galvanically isolated clock signal, for example, by providing that the corrected PWM signal changes only at a rising edge of the galvanically isolated clock signal.

The corrected PWM signal output by the correction circuit is now resynchronized with the clock signal, so that the power transistors switch exactly at the desired points in time. Thus, noise in the control of the transistors is considerably reduced, and the positioning accuracy of a positioning device is significantly improved. In tests, the jitter in the control of the power transistors could be reduced by a factor of ten by means of the correction circuit.

Since high voltages are switched in the area of power converters, spurious signals from the isolators (also referred to as "common mode transients"). Therefore, the correction circuit is configured as a clock-edge-controlled D flip-flop having a clock-enable input. A blocking signal can be applied to this clock-enable input at points in time at which such spurious signals may occur; i.e., at the moment when a power transistor switches. This unwanted switching of one of the power transistors, since such switching operations may cause a short-circuit if both power transistors of a half-bridge thereby become conductive. Altogether, using this measure, an isolated transmission of the PWM signals with very little jitter is achieved, while at the same time avoiding problems associated with spurious signals, which typically occur on isolators when high voltages have to be switched rapidly. This enables a particularly accurate and low-noise control of electric drives.

FIG. 1 illustrates a circuit arrangement according to an embodiment of the present invention. A clock generator C provides a substantially accurate clock signal CLK to a logic circuit DSP. Logic circuit DSP serves to generate PWM signals G, which ultimately serve for pulse-width modulated control of a drive. In addition, the logic circuit generates a blocking signal BLK. Internally, the logic circuit uses a clock signal CLK' which is time-shifted with respect to clock signal CLK and generated from clock signal CLK using, for example, a PLL circuit. The logic circuit may be configured, for example, as a DSP or FPGA.

Logic circuit DSP is disposed in a low-voltage portion LV. Since, ultimately, an operating voltage of several hundred volts is to be switched, signals G, BLK and CLK must be transmitted via isolators Si, Ci into high-voltage portion HV, where they are further processed as galvanically isolated signals Giso, CLKiso and BLKiso.

First isolator Si may be configured, for example, as an optocoupler. Optocouplers have the advantage of being capable of transmitting signals independently of the frequency (in particular also constant DC signals), but may cause a considerable amount of jitter in the signal edges. If a PWM signal transmitted in this manner were used directly for controlling gate drivers GD of power transistors T1, T2, then these would be controlled by a signal containing a significant amount of noise. The edges of gate voltage UG would have a non-constant temporal position deviating from the setpoint provided by logic circuit DSP; i.e., the jitter caused by isolator Si.

Therefore, second isolator Ci for clock signal CLK is configured as a digital high-high-frequency transmitter with particularly low jitter. Such isolators are based, for example, on capacitive or inductive transmission of the signals and are components commonly used in data transmission. The jitter of this second isolator Ci should be lower than that of first Si by a factor of at least two, preferably a factor of ten or twenty, because the clock signal CLKiso transmitted via the second isolator serves as a reference for the resynchronization of PWM signal Giso. It is only in this way that the jitter in the control of power transistors T1, can be successfully suppressed. Since clock signal CLK is a signal of constant high frequency (e.g., 100 MHz), it is possible here to use an isolator which, like a high-frequency transmitter, is only suitable for high-frequency signals, but in return produces a particularly small amount of jitter.

Using a correction circuit DFF, signal Giso, which contains a large amount of jitter, is synchronized to the low-jitter clock signal CLKiso. This is accomplished using a flip-flop circuit. The jitter-compensated PWM signal Gff so obtained always follows signal Giso when clock signal CLKiso has a rising edge. In this manner, a temporal correlation is achieved between the edges of PWM signal Gff again, this temporal correlation corresponding to that initially defined by logic circuit DSP. Signal Gff then controls a gate driver GD, which finally provides a gate voltage UG to power transistor T1, T2.

In FIG. 1, only the control circuit for first transistor T1 is shown, but second transistor T2 is controlled in exactly the same way, if only to obtain identical propagation times for all signals.

When power transistor T1 switches, the voltage at first isolator Si changes very rapidly. This may result in a spurious signal on the signal line of Giso, and thus in an unwanted switching operation of transistor T1. If, as a result, both transistors T1, T2 become conductive at the same time, such a switching operation may result in destruction of the power converter.

Therefore, the circuit arrangement has another advantageous feature. Correction circuit DFF is configured as a clock-edge-controlled D flip-flop having a clock-enable input CE. As long as a blocking signal BLKiso is present as a logic one (high) at this input CE, the flip-flop operates as intended, synchronizes signal Giso with the next rising edge of CLKiso and outputs the resulting jitter-compensated signal Gff. However, if a logic zero (low) is present as a blocking signal BLKiso, then synchronization is interrupted. Any state changes at input D of the flip-flop are then no longer passed on to output Q.

Therefore, logic circuit DSP additionally generates a blocking signal BLK which normally represents a logic one, but changes to a logic zero for a certain period of time after a certain delay after each state change in PWM signal G. The delay is selected such that the switching operation in signal Gff associated with the state change in G has already occurred, but the time delay Tpdgd of gate driver GD has not yet elapsed. Thus, transistor T1 has not yet switched. Therefore, correction circuit DFF then no longer accepts any changes on signal line Giso. Any spurious signals which may occur during the switching of transistor T1 are ignored. After a certain time, when such spurious signals can no longer occur, blocking signal BLKiso enables correction circuit DFF again. Like PWM signal G, blocking signal BLK is transmitted via a second channel of first isolator Si (or an isolator of identical design) and thus becomes galvanically isolated blocking signal BLKiso. This ensures comparable propagation times for G and BLK.

In addition, blocking signal BLKiso is passed through a low-pass filter LP to suppress short spurious signals there as well. In order to nevertheless achieve a rapid decrease to logic zero, low-pass filter LP is bridged by a diode. Such a low-pass filter could, in fact, also filter spurious signals in Giso, but would contribute to a degradation of the PWM signal.

Figure 2:
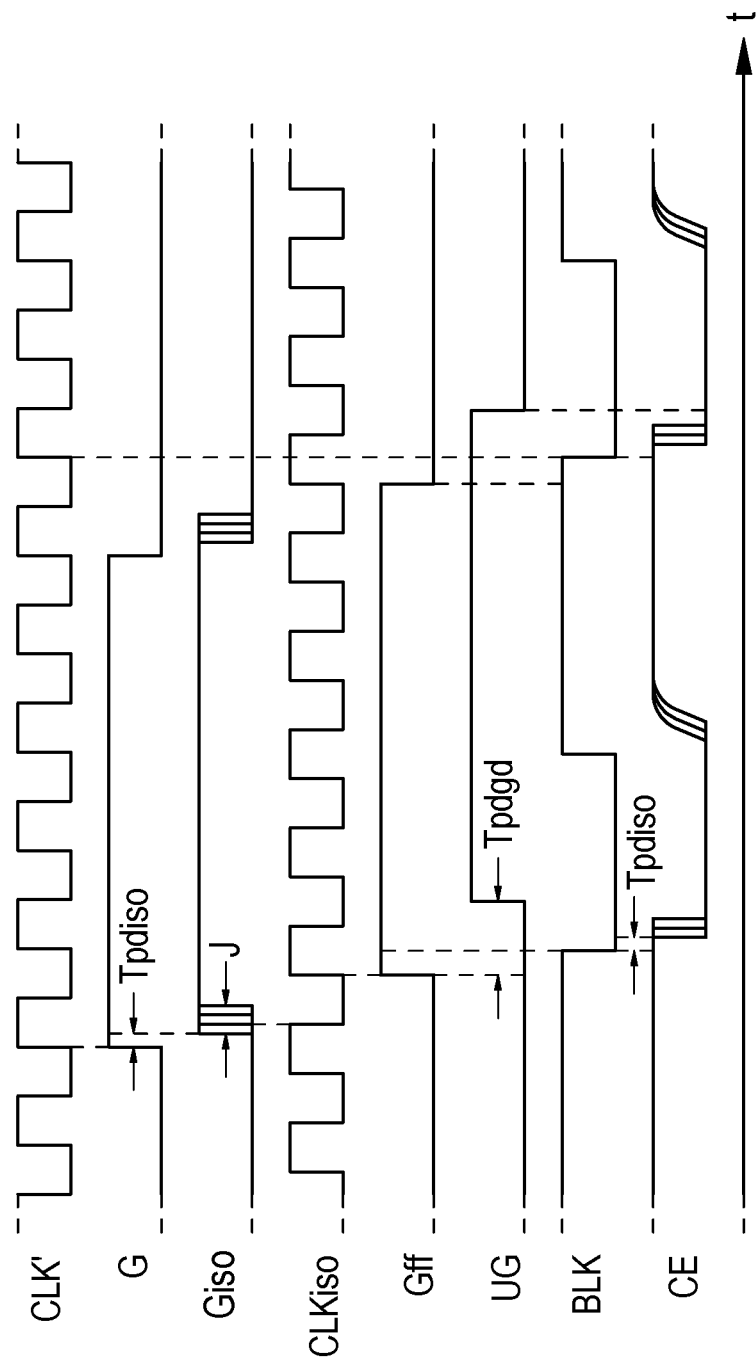
FIG. 2 shows a signal diagram.

FIG. 2 shows an exemplary time sequence of the individual signals.

As mentioned earlier, logic circuit DSP generates a clock signal CLK' which is time-shifted with respect to actual clock signal CLK. This temporal offset makes it possible to account for the delays occurring during the processing of all signals, and ultimately to provide a suitable offset between the processing on low-voltage side LV and the processing on high-voltage side HV. In particular, the offset between CLK and CLK' must account for the setup/hold times of correction circuit DFF.

Also shown is PWM signal G, which is generated by logic circuit DSP and intended to turn on transistor T1 for a certain period of time. The switching of PWM signal G occurs with rising edges of CLK'. After the galvanically isolated transmission, the signal Giso is present, the edges of which are subject to a certain jitter J, as indicated. The multiplicity of plotted edges indicates that these edges are not only subject to a certain delay Tpdiso, but, in addition, that this delay is not constant, which is why the original signal G becomes noisy. Jitter J is primarily caused by isolator Si, but other switching elements in the signal path, or electromagnetic interferences, also contribute to jitter J.

In contrast, the galvanically isolated clock signal CLKiso is not, or at least much less, affected by jitter. A second isolator Ci with lowest possible jitter is a prerequisite for this.

As can also be seen, correction circuit DFF (i.e., the flip-flop-circuit) ensures that, in the corrected PWM signal Gff, each edge in signal Giso is not latched until the next rising edge of CLKiso. In this way, the PWM signal is resynchronized to clock signal CLKiso. The offset between CLK and CLK' must be selected such that, taking into account propagation time Tpdiso and maximum jitter J, the next rising edge of CLKiso can switch an edge of Giso to output Q of correction circuit DFF. This means that the switching of Giso should occur approximately in the region of a falling edge of CLKiso.

Signal Gff at output Q of correction circuit DFF controls gate driver GD, so that the gate of transistor T1 is driven with voltage UG with a delay time Tpdgd.

FIG. 2 further illustrates how blocking signal BLK varies over time. Blocking signal BLK, which is normally at a logic one (i.e., high), switches to zero (i.e., to low) after each change in state of Gff, but still within time delay Tpdgd of the gate driver. In this connection, time delay Tpdiso of first isolator Si must also be taken into account, because this time delay also affects blocking signal BLK. Because of the diode across low-pass filter LP, the input then rapidly drops to low. The switching operation is, in fact, performed on transistor T1, but any resulting spurious signals on Giso are suppressed. After a certain time (when spurious signals can no longer occur because the switching on transistor T1 is complete), BLKiso returns to high and, due to low-pass filter LP, clock-enable input CE of correction circuit DFF follows in a slowly increasing manner. Thus, correction circuit DFF is ready for the next switching operation in Giso.

Thus, the circuit arrangement makes it possible to control transistors T1, T2 with very little jitter, thus enabling accurate positioning of the drives, while at the same time avoiding problems associated with spurious signals, which may occur during individual switching operations on the isolators While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

What is claimed is:

1. A circuit arrangement for controlling power transistors of a power converter, the circuit arrangement comprising:
a logic circuit configured to generate a pulse-width modulation (PWM) signal and a clock generator configured to generate a clock signal;
a first isolator configured to galvanically isolate transmission of the PWM signal into a high-voltage portion of the power converter so as to produce a galvanically isolated PWM signal and a second isolator configured to galvanically isolate transmission of the clock signal into a high-voltage portion of the power converter so as to produce a galvanically isolated clock signal, the first isolator being configured transmit both DC voltage signals and AC voltage signals; and
a correction circuit configured to correct jitter of the galvanically isolated PWM signal based on the galvanically isolated clock signal to produce a corrected PWM signal, wherein the second isolator exhibits a jitter lower than that of the first isolator by a factor of at least two.

2. The circuit arrangement as recited in claim 1, wherein the first isolator is in a form of an optocoupler or a digital signal isolator, and wherein the second isolator is in a form of a high-frequency converter.

3. The circuit arrangement as recited in claim 1, wherein the correction circuit is configured as a flip-flop circuit.

4. The circuit arrangement as recited in claim 3, wherein the flip-flop circuit has an input to which the galvanically isolated PWM signal is applied, a clock input to which the galvanically isolated clock signal is applied, and an output which does not follow the galvanically isolated PWM signal until a next rising edge of the galvanically isolated clock signal, such that the corrected PWM signal with reduced jitter is generated.

5. The circuit arrangement as recited in claim 3, wherein the flip-flop circuit is configured as a clock-edge-controlled D flip-flop having a clock-enable input.

6. The circuit arrangement as recited in claim 5, wherein a galvanically isolated blocking signal is applied to the clock-enable input of the clock-edge-controlled D flip-flop, the galvanically isolated blocking signal preventing a corrected PWM signal generated at an output of clock-edge-controlled D flip-flop from changing during switching of one of the power transistors.

7. The circuit arrangement as recited in claim 6, wherein the logic circuit is configured to generate a blocking signal with a time delay relative to a change of the PWM signal, the blocking signal, like the PWM signal, being transmitted via the first isolator and being fed as the galvanically isolated blocking signal to the clock-enable input of the correction circuit.

8. The circuit arrangement as recited in claim 6, wherein the galvanically isolated blocking signal is fed to the clock-enable input of the correction circuit via a low-pass filter.

9. The circuit arrangement as recited in claim 8, wherein the low-pass filter is bridged by a diode.

10. The circuit arrangement as recited in claim 1, wherein the corrected PWM signal generated by the correction circuit controls a gate driver for one of the power transistors.

11. The circuit arrangement as recited in claim 1, wherein the second isolator for galvanically isolated transmission exhibits a jitter lower than that of the first isolator by a factor of 10.

12. The circuit arrangement as recited in claim 1, wherein the second isolator for galvanically isolated transmission exhibits a jitter lower than that of the first isolator by a factor of twenty.

13. The circuit arrangement as recited in claim 1, wherein the second isolator for galvanically isolated transmission exhibits a jitter lower than that of the first isolator by a factor of between two and twenty.

* * * * *